(12) United States Patent
Vicard et al.

(10) Patent No.: US 8,471,773 B2
(45) Date of Patent: Jun. 25, 2013

(54) ASSEMBLY OF RADIOFREQUENCY CHIPS

(75) Inventors: Dominique Vicard, Saint Nazaire les Eymes (FR); Jean Brun, Champagnier (FR); Benoît Lepine, Grenoble (FR)

(73) Assignee: Commissariat a l'Energie Atomique, Paris (FR)

(*) Notice: Subject to any disclaimer, the term of this patent is extended or adjusted under 35 U.S.C. 154(b) by 619 days.

(21) Appl. No.: 12/665,419

(22) PCT Filed: Jun. 18, 2008

(86) PCT No.: PCT/FR2008/051079
§ 371 (c)(1),
(2), (4) Date: Jun. 9, 2010

(87) PCT Pub. No.: WO2009/004243
PCT Pub. Date: Jan. 8, 2009

(65) Prior Publication Data
US 2010/0245182 A1    Sep. 30, 2010

(30) Foreign Application Priority Data
Jun. 21, 2007 (FR) .................................. 07 04445

(51) Int. Cl.
*H01Q 1/24* (2006.01)
(52) U.S. Cl.
USPC ........................................... 343/702

(58) Field of Classification Search
USPC ................. 343/702, 895, 795, 866, 741–742
See application file for complete search history.

(56) References Cited

U.S. PATENT DOCUMENTS

| | | | | |
|---|---|---|---|---|
| 6,930,401 B2* | 8/2005 | Usami | ........................... | 257/787 |
| 7,863,718 B2* | 1/2011 | Usami | ........................... | 257/679 |
| 8,017,441 B2* | 9/2011 | Usami | ........................... | 438/113 |
| 8,154,456 B2* | 4/2012 | Furumura | .............. | 343/700 MS |
| 8,237,622 B2* | 8/2012 | Furumura et al. | ............ | 343/895 |

FOREIGN PATENT DOCUMENTS

| | | |
|---|---|---|
| DE | 19908172 A1 | 8/2000 |
| EP | 1630728 A | 3/2006 |

OTHER PUBLICATIONS

Search Report issued in PCT/FR2008/051079 on Mar. 25, 2009.

* cited by examiner

*Primary Examiner* — Huedung Mancuso
(74) *Attorney, Agent, or Firm* — Vedder Price P.C.

(57) ABSTRACT

The invention relates to the fabrication of radiofrequency transmission/reception devices. The invention makes provision for: the making of radiofrequency transmission/reception chips devoid of antennas; the connecting in series of the chips by at least two conducting wire elements whose respective lengths between two neighboring chips are chosen as a function of the transmission/reception frequency, each element contacting electrically at least one terminal of a chip and ensuring an at least temporary function of mechanical holding of the chips chainwise; and the cutting at regular intervals of the serial connection to form, for each chip, two strands of an antenna of the device.

15 Claims, 4 Drawing Sheets

ASSEMBLY OF RADIOFREQUENCY CHIPS

FIELD OF THE INVENTION

The present invention generally relates to electronic circuits and, more specifically, to the forming of microelectronic devices equipped with radio frequency transceiver means.

DISCUSSION OF PRIOR ART

Radio frequency microelectronic transceiver devices are more and more used for purposes of remote identification of objects to which such devices are associated. It is then often spoken of electronic tags (RFID). The functionalities of such electronic tags may be limited to the transmission of an identifier or may comprise more complex functions (remote transmission of results of measurement performed by sensors integrated to the chip, processing of data received from a distant element, etc.).

FIG. 1 is a simplified block diagram of a radio frequency communication system between a read or read-write terminal 1 (READER) and an electronic device 2 (TAG) of electronic tag type. Terminal 1 and tag 2 comprise antennas, shown in simplified fashion by inductive elements L1 and L2. According to the frequency band used for the transmission, antennas L1 and L2 are loop or dipole antennas. In the example shown in FIG. 1, inductive elements L1 and L2 are respectively in series and in parallel with capacitive elements C1 and C2 (shown in dotted lines) with which they form oscillating circuits, generally tuned to a central frequency of an operating frequency band.

Typically, for frequency bands from a few hundreds of kilohertz to a few tens of megahertzes, antennas L1 and L2 are loop-shaped and for frequencies on the order of from several hundreds of Megahertz to a few gigahertzes, the antennas are of dipole type.

Most often, electronic tag 2 draws the power necessary to the operation of the electronic circuit that it comprises form the radio frequency field radiated by terminal 1.

Many structures of electronic tags, and more generally of radio frequency transceiver chips and of read or read-write terminals, are available.

The forming of antenna L2 on the electronic tag side uses techniques derived from the microelectronics industry in the manufacturing of integrated or printed circuits (etching or printing of conductive tracks). This non-negligibly impacts the cost of the electronic tag.

It would be desirable to have a radio frequency transceiver device with an antenna which is less expensive to manufacture.

It would further be desirable to have a simplified method for manufacturing a radio frequency transceiver device equipped with its antenna.

In certain applications, it is desired to associate several electronic tags with a same object. Said tags must then be individually attached to the concerned object (for example, a very long pipe).

A technique for forming microelectronic chips connected to one another by a cable element for electrically connecting the chip to the outside is known from document WO-A-2008/025889, where several wires may be provided to then form, at the same time, antennas and the power supply of an RFID component.

It would be desirable to take advantage of this technique to ease the forming of antennas of radio frequency transceiver devices without for them to be interconnected by a power supply lead.

It would further be desirable to have a simple solution for associating several radio frequency transceiver chips, be it before their assembly on the object for which they are intended or in use.

To achieve all or part of these objects as well as others, the present invention provides a method for manufacturing radio frequency transceiver devices, comprising:

the forming of radio frequency transceiver chips having no antennas;

the series connection of the chips by at least two conductive cable elements having their respective lengths between two neighboring chips selected according to the transmission-reception frequency, each element electrically contacting at least one terminal of a chip and at least temporarily mechanically maintaining the chips chained; and the cutting at regular intervals of the series connection to form, for each chip, two strands of an antenna of the device.

According to an embodiment, two conductive cable elements are placed on either side of the chips, in the vicinity of their respective lateral edges in a first direction.

According to an embodiment, an intermediary element supporting at least one conductive section connecting the two conductive cable elements is provided between two neighboring chips, and is intended to be cut to form, for each chip, a loop antenna.

According to an embodiment, the chips are placed on a support strip before connection by the conductive cable elements.

According to an embodiment, a cable connection element is, before cutting of the series connection, connected to the different chips to form, after cutting of the series connection, a chain of radio frequency devices.

According to an embodiment, the strands are wound around the connection element.

According to an embodiment, each chip comprises at least one area for receiving a conductive cable element.

The present invention also provides a radio frequency transceiver device, comprising:

a microelectronic chip integrating radio frequency transceiver circuits; and at least two wire antenna strands.

The present invention also provides a chain of radio frequency transceiver devices, comprising several electronic chips integrating radio frequency transceiver circuits and connected to one another by at least two conductive cable elements connected to antenna connection pads of the chips, the respective lengths of the elements between two neighboring chips being selected according to the transmission-reception frequency.

According to an embodiment, an additional connection element, having a length greater than the respective lengths of the conductive elements between two neighboring chips, connects the chips after cutting of the conductive elements between the chips.

BRIEF DESCRIPTION OF THE DRAWINGS

The foregoing objects, features, and advantages of the present invention, as well as others, will be discussed in detail in the following non-limiting description of specific embodiments in connection with the accompanying drawings, among which.

The same elements have been designated with the same reference numerals in the different drawings, which are not to scale.

DETAILED DESCRIPTION

For clarity, only those steps and elements which are useful to the understanding of the invention have been shown and will be described. In particular, the electronic circuits internal to the radio frequency transceiver devices have not been detailed, the invention being compatible with usual circuits (for example, measurement sensors, identifiers of an object, etc.) according to the aimed application. The steps of batch manufacturing of the microelectronic chips have not been detailed either, the invention being here again compatible with usual techniques.

The invention will be described hereafter in relation with an example of RFID chips, but it more generally applies to any chip or miniaturized radio frequency transceiver circuit.

Figure 1:
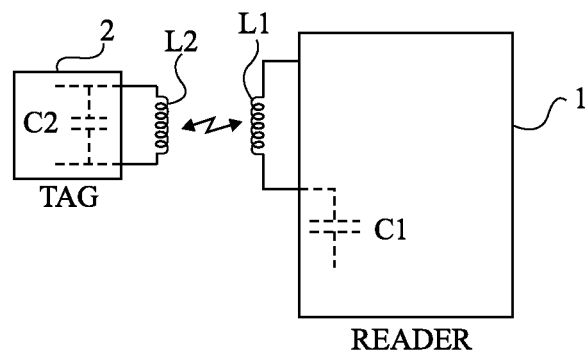
FIG. 1, previously described, is a block diagram of a radio frequency transceiver system of the type to which the present invention applies as an example.
Figure 2:
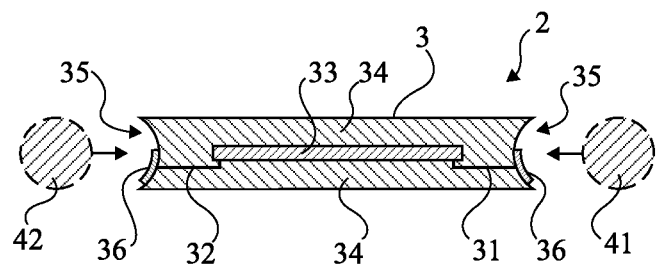
FIG. 2 is a simplified cross-section view of an example of a microelectronic chip capable of receiving cable elements.

FIG. 2 is a simplified cross-section view of an microelectronic chip 3 capable of forming the chip of an electronic tag of the type of tag 2 of FIG. 1. One or several integrated circuits and components are supported by a substrate 33, which has at least two pads electrically connected (connections 31 and 32) to contacting areas accessible from the outside of chip 3 in reception areas 35 intended for cable connection elements 41 and 42 (shown in dotted lines). In the example of FIG. 2, substrate 33 is coated on both sides with an insulating and protective material 34, for example, an epoxy resin. Reception areas 35 are created on both sides of the chip in a first direction. The structure described in relation with FIG. 2 is an example of the type described in document WO-A-2008/025889.

According to the invention, areas 36 are intended to from antenna connection contacting areas.

Figure 3:
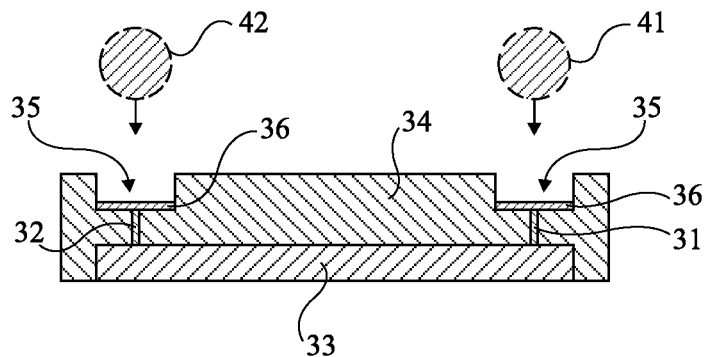
FIG. 3 is a simplified cross-section view of an another example of a microelectronic chip capable of receiving cable elements.

FIG. 3 is a simplified cross-section view of another example of a microelectronic chip 3. As compared with the example of FIG. 2, the rear surface of substrate 33 is not covered with resin. Reception areas 35 of wires 41 and 42 are formed by parallel recesses formed in chip 3. Such recesses may for example be grooves. Multiple groove shapes are possible, especially a square-based shape, a V shape, a truncated V shape, or an arc of a circle. The dimensions and the shape of the recesses will be, as in the previous example, preferentially selected according to the characteristics of the cable connection elements. As an example, the depth and the width of a groove may vary within a range from 20 to 100 µm for a connection element 41 or 42 having a diameter from 20 to 100 µm. Metalized areas 36 will be provided, for example at the bottom of recesses 35, and are used according to the present invention as antenna connection contacting areas, for example, by means of conductive vias 32 in insulating material 34. Recesses 35 may be directly formed in substrate 33, preferentially next to the microelectronic components. Recesses 35 may be formed by any adapted technique, for example, by dry or wet etching, by sawing, etc.

The structures of FIGS. 2 and 3 may have various alterations, for example, such as described in the above-mentioned document.

Figure 4A:
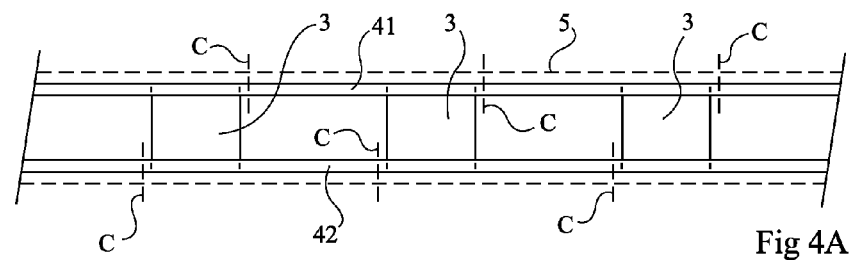
FIGS. 4A and 4B are top views of an embodiment, respectively of a chain of chips before separation and of a radio frequency transceiver device obtained from this chain.

FIG. 4A is a top view of a chain of RFID chips 3 according to an embodiment of the present invention. The chain illustrated in FIG. 4A is for example obtained, after dicing of chips 3 from a wafer at least partially made of a semiconductor material, by placing the chips on a strip 5 temporarily supporting them at regular intervals. Conductive wires 41 and 42 are then arranged, preferably laterally with respect to chips 3, in electric contact with the contacting areas of each chip, accessible from housings 35 provided for wires 41 and 42. For example, the contacting areas are metallizations formed, during the wafer batch processing, inside of the lateral housings. The assembly of wires 41 or 42 by conductive contact with conductive areas 36 of chip 3 is obtained by conductive adhesive, by welding, or any other adapted means.

Finally, wires 41 and 42 are cut at regular intervals of the chain, for example, at one edge of each chip 3 for wire 41 and at the other edge of each chip for wire 42 (along the dotted lines c illustrated in FIG. 4A), to obtain an RFID device 2 equipped with its antenna.

Figure 4B:
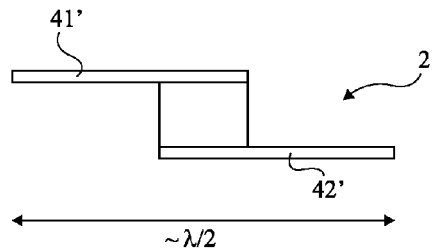

FIG. 4B is a simplified top view of an RFID device 2 obtained after cutting of wires 41 and 42 of FIG. 4A. Each chip 3 is associated with two strands 41' and 42' originating from temporary connection wires 41 and 42 to form a device 2.

The length of strands or sections 41' and 42' which remain once the chips have been separated, is selected to be adapted to the desired length of the radio frequency transceiver antenna. In the example of antenna of the type illustrated in FIG. 4B, this length is, for example, on the order of $\lambda/2$ for the addition of the two aligned strands 41' and 42', where $\lambda$ represents the wavelength of the central frequency of the transmit/receive band.

The diameter of cable elements 41 and 42 is greater than the diameter of possible connection wires (for example, 32 and 33, FIG. 2) internal to chip 3. For example, this diameter has the same order of magnitude (ratio between 1/4 and 1) as the thickness of finished chip 3.

As long as wires 41 and 42 have not been cut, they mechanically hold chips 3 together, enabling to maintain them chained, for example, in rolled fashion, before their final assembly on the object that they are intended to identify.

Figure 5A:
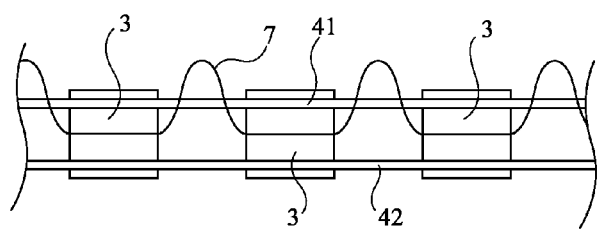
FIGS. 5A and 5B are top views of another embodiment of a chain of radio frequency devices, respectively before and after the forming of the antennas.
Figure 5B:
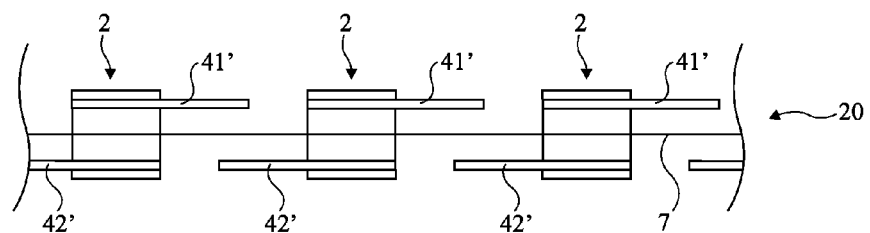

FIGS. 5A and 5B are top views illustrating another embodiment, respectively before and after cutting of wires 41 and 42 to separate the antennas. According to this example, chips 3 remain connected to one another by means of a cable connection element 7. Cable 7 is attached to chips 3 before cutting of wires 41 and 42, for example, while the chips are still in wafers or supported by a temporary strip such as strip 5 of FIG. 3A. The length of the sections of connection element 7 between each chip 3 is selected to be greater than the respective lengths of strands 41' and 42'. This length depends on the desired spacing between two radio frequency devices in the aimed application and for example ranges from a few centimeters to a few meters. The presence of connection element 7 enables to keep the RFID devices in a chain 20 even after the antennas have been separated, and thus until their final implantation on the object.

The case in point may for example be to place a chain 20 of RFID chips along an underground line to make it easier to locate.

According to another example, connection cable 7 is incorporated instead of a weaving thread to regularly distribute the RFID chips in a textile.

Cable 7 is for example cut on demand according to the final desired chain length. Cable 7 is preferably insulating and its mechanical resistance depends on the aimed application. The cross-section of cable 7 may be circular or other (for example, rectangular), single-strand or multistrand.

The connection element(s), be they connection elements 41 and 42 intended to form antenna strands 41' and 42' or connection elements intended to form a final supporting cable 7, may have a round, square, or other cross-section and may be formed by a cable or several cables. As to wires 41 and 42 intended to form the antennas, these elements are conductive (and possibly sheathed with an insulator except at the contacts with the chip).

According to a specific embodiment, the different chips are formed on a semiconductor or insulating substrate wafer. They are interconnected by at least one cable connection element (either wires 41 and 42 intended to form the two antennas, or permanent connection element 7, or both). Then, the substrate is structured to dissociate chips 3, which are then series connected by the sole flexible mechanical connection provided by the connection element(s), from one another. The dissociation of chips 3 is conventionally carried out in the case of a solid substrate, for example by sawing, while being careful not to cut the connection element(s).

Figure 6:
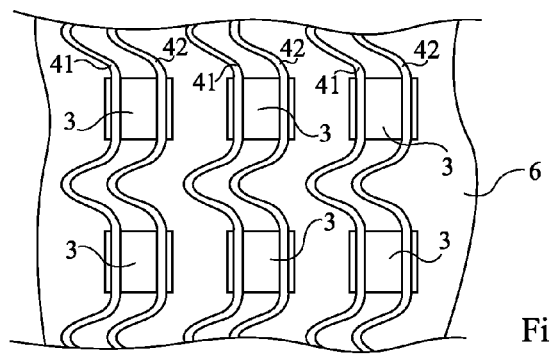
FIG. 6 is a simplified top view of a portion of an integrated circuit wafer.

FIG. 6 shows a portion 6 of a substrate wafer on which several RFID chips 3 according to this embodiment are formed. In this example, connection elements 41 and 42 are associated with chips 3 before cutting. This may avoid the use of a temporary support strip. However, according to the required antenna length, this may require a relatively large spacing between chips with respect to the spacing required for the cutting paths. A length of wires 41 and 42 between two chips is preferably then provided, as shown, to be greater than the spacing between these chips on the wafer, to correspond to the desired antenna lengths.

If strip 5 (FIG. 4A) is used as a temporary support to temporarily maintain chips 3 chained, the assembly of wires 41 and 42 intended to form the antenna strands may occur subsequently to the placing of chips 3 on strip 5.

Figure 7A:
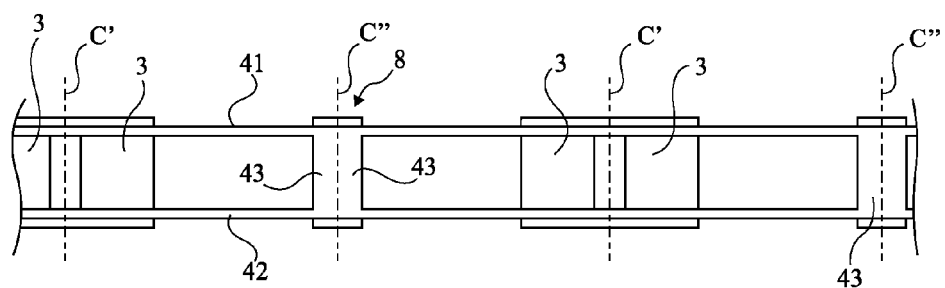
FIGS. 7A and 7B are top views of another embodiment of radio frequency devices, respectively chained and once separated, applied to loop antennas.
Figure 7B:
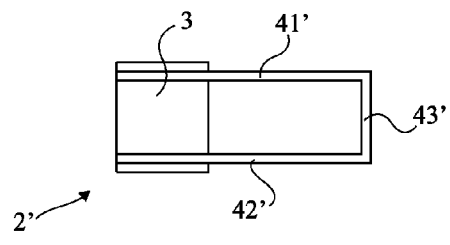

FIGS. 7A and 7B are top views, respectively before and after cutting of the antenna wires, of another embodiment more specifically adapted to the forming of loop antennas.

According to this example, in the chain structure of the chips before cutting of the antennas (FIG. 7A), connection wires 41 and 42 are, between two chips, connected to each other by intermediary elements 8 comprising a conductive section 43 connecting wires 41 and 42 to each other. For example, chips 3 are paired two by two so that first cutting lines (c') are located between two chips without letting any wire remain between them and that second cutting lines (c") are located at the level of connection elements 8 to leave, on either side of cutting line c", a strand 43' connecting strands 41' and 42' (FIG. 7B). The width of connection sections 43 depends on the width of cutting line c" to preserve, on each side, a conductive section 43'. As a variation, two parallel sections 43' are formed on or in elements 8 on either side of cutting line c". In the example of FIGS. 7A and 7B, RFID devices 2' (FIG. 7B) are provided to be finally separated.

However, a variation with a permanent connection element of the type illustrated in relation with FIGS. 5A and 5B may also be provided.

Figure 8A:
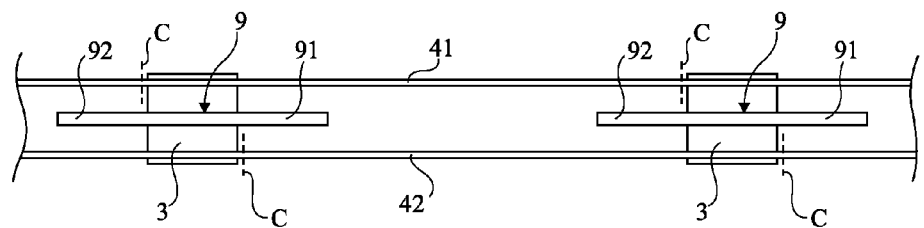
FIGS. 8A and 8B are simplified top views illustrating, respectively in the chained state and once separated, another embodiment still of radio frequency transceiver devices.
Figure 8B:
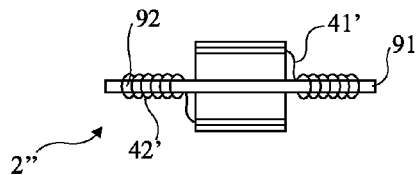

FIGS. 8A and 8B are top views of still another embodiment of RFID chips, respectively chained and separated.

According to this embodiment, elements 9 having a general elongated shape and protruding from both sides of each chip 3 are placed thereon after cutting from the wafers or are integrated therein with sections 91 and 92 protruding from both sides of each chip 3. Elements 9 are made of an insulating material or are sheathed with an insulating material and are intended to receive respective antenna strands 41' and 42' which are then wound in a coil (FIG. 8B). If the obtained RFID devices 2" are intended to remain chained, elements 9 may be sections of a supporting cable (7, FIGS. 5A, 5B). Elements 9 are indifferently flexible or rigid and receive strands 41' and 42', for example, as a textile "taping". As a variation, elements 9 may be made of a material selected for its electromagnetic properties (for example, ferrite).

An advantage of the embodiment of FIGS. 8A and 8B is that the characteristics of antennas are improved, in particular, by the increase of the imaginary part of their impedance.

Figure 9A:
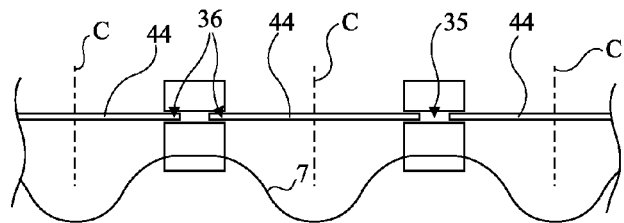
FIGS. 9A and 9B are simplified top views illustrating another embodiment still of a chain of radio frequency transceiver devices.
Figure 9B:
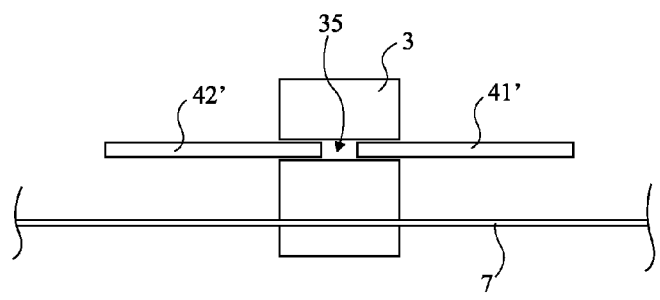

FIGS. 9A and 9B illustrate, in views to be compared with the previous drawings, a variation according to which each antenna is formed of two strands 41' and 42' aligned on either side of each chip. In this case, the series connection of the chips before cutting of the conductive wires is obtained by a large number of wires 44 (FIG. 8A) having their respective lengths corresponding to twice the length desired for the antenna strands, and areas 36 of contact with the chips are aligned. A supporting cable 7 may be intended to connect the devices after cutting of conductive wires 44. The position of wires 44 across the width of chips 3 is indifferent (with respect to a longitudinal direction defined by the direction of wires 44).

The different embodiments and variations described hereabove may of course be combined.

An advantage of the described embodiments is that they enable to obtain RFID devices having their antennas formed by cable elements, which makes them less expensive than the deposition of conductive ink on an insulating substrate.

Another advantage is that the provided technique preserves the possibility of radio frequency chip chains at least until assembly on the final object (by cutting of the antenna strands). This allows coil processings of the chips, for example, galvanic, coating processes, etc.

Another advantage is that the described embodiments even enable to preserve the chained radio frequency chip structure in the final application.

Various embodiments have been described, and various alterations and modifications will occur to those skilled in the art. In particular, the selection of the dimensions to be given to the antenna strands depends on the application and especially on the desired operating frequency as well as on the other components (especially the capacitive elements) present on the electronic chip side.

Further, the practical implementation of the invention is within the abilities of those skilled in the art based on the functional indications given hereabove.

Finally, although the invention has been described in relation with an example of devices each provided with an antenna, two antennas per device may be provided to allow an operation over several frequency bands. For example, in a variation of the embodiment of the devices of FIGS. 7A and 7B, an element 8 may be provided between each chip and the respective lengths of strands 41' and 42' are different on the two sides of a same chip, to obtain two inductive elements of different values. The setting of the operating frequency band by using a single antenna may also be obtained, as current, by means of a setting internal to chip 3 by varying capacitive element C2 to modify the tuning frequency of the oscillating circuit.

The invention claimed is:

1. A method for manufacturing radio frequency transceiver devices, comprising:
    forming of radio frequency transceiver chips having no antennas;
    serially connecting the chips, the chips being connected to each other or to an intermediary element between two chips by at least two conductive cable elements, wherein the at least two conductive cable elements have their respective lengths selected according to the transmission-reception frequency, and each conductive cable element electrically contacting at least one terminal of a chip and at least temporarily mechanically maintaining the chips chained; and
    cutting at regular intervals of the series connection to form, for each chip, the strands of an antenna of the device.

2. The method of claim 1, wherein each conductive cable element is, before cutting, common to more than two chips.

3. The method of claim 1, wherein two conductive cable elements are placed on either side of the chips, in the vicinity of their respective lateral edges in a first direction.

4. The method of claim 1, wherein each intermediary element supports at least one conductive section connecting the conductive cable elements and is intended to be cut to form, for each chip, a loop antenna.

5. The method of claim 1, wherein, after the cutting, two strands of the antenna of a chip extend on either side of this chip.

6. The method of claim 1, wherein the chips are placed on a support strip before connection by the conductive cable elements.

7. The method of claim 1, wherein a cable connection element is, before cutting of the series connection, connected to the different chips to form, after cutting of the series connection, a chain of radio frequency devices.

8. The method of claim 7, wherein the strands are wound around the connection element.

9. The method of claim 1, wherein each chip comprises at least one area for receiving a conductive cable element.

10. The method of claim 1, wherein the cutting of the series connection is performed at regular intervals.

11. A radio frequency transceiver device, characterized in that it comprises:
    a microelectronic chip integrating radio frequency transceiver circuits; and
    at least two wire antenna strands obtained by application of the method of claim 1.

12. A chain of radio frequency transceiver devices, comprising several electronic chips integrating radio frequency transceiver circuits and connected to one another, the chips being connected to each other or to an intermediary element between two chips by at least two conductive cable elements connected to antenna connection pads of the chips, wherein the at least two conductive cable elements have their respective lengths selected according to the transmission-reception frequency.

13. The chain of devices of claim 12, wherein an additional connection element, having a length greater than the respective lengths of the conductive elements between two neighboring chips, connects the chips after cutting of the conductive elements between the chips.

14. The chain of devices of claim 12, obtained by implementation of the method of claim 1.

15. A pipe comprising the chain of devices of claim 12.

* * * * *